US006869289B2

(12) United States Patent
Sabatier et al.

(10) Patent No.: US 6,869,289 B2
(45) Date of Patent: Mar. 22, 2005

(54) MULTICONTACT ELECTRIC CONNECTOR

(75) Inventors: André Sabatier, Villeneuve-Saint-Georges (FR); Claude Chasserieau, Chevannes (FR); Vincent Chasserieau, Chevannes (FR)

(73) Assignee: Probest, Corbeil Essones Cedex (FR)

( * ) Notice: Subject to any disclaimer, the term of this patent is extended or adjusted under 35 U.S.C. 154(b) by 23 days.

(21) Appl. No.: 10/398,023

(22) PCT Filed: Sep. 24, 2001

(86) PCT No.: PCT/FR01/02954

§ 371 (c)(1), (2), (4) Date: Apr. 1, 2003

(87) PCT Pub. No.: WO02/29423

PCT Pub. Date: Apr. 11, 2002

(65) Prior Publication Data

US 2004/0005792 A1 Jan. 8, 2004

(30) Foreign Application Priority Data

Oct. 5, 2000 (FR) ........................................... 00 12851

(51) Int. Cl.[7] ............................................... H01R 12/00
(52) U.S. Cl. .......................................... 439/66; 439/482
(58) Field of Search .......................... 439/66, 591, 482, 439/65, 74; 324/72.5, 756

(56) References Cited

U.S. PATENT DOCUMENTS 4,506,215 A * 3/1985 Coughlin .................. 324/72.5
4,843,315 A * 6/1989 Bayer et al. ................ 324/756
4,963,822 A * 10/1990 Prokopp .................... 324/72.5

FOREIGN PATENT DOCUMENTS

EP 0 165 331 A 12/1985
EP 0 283 545 9/1988
WO WO 97/43655 * 11/1997 ........... H01R/23/72

* cited by examiner

*Primary Examiner*—Renee Luebke
*Assistant Examiner*—Felix O. Figueroa
(74) *Attorney, Agent, or Firm*—Young & Thompson

(57) ABSTRACT

Multiple-contact electrical connectors comprising in particular a base 1, two pairs 2, 3 of input/output terminals 4–6, two electrically conductive needles 11, 12, two electrically insulating plates 21, 22 having orifices 31–34, the needles being slidably mounted relative at least to the plate 22, and means for fixing the two plates 21, 22 relative to the base 1. The connector further comprises: at least two other plates 23, 24 positioned between the two plates 21, 22 and in which orifices 41–44 are formed, the needles being slidable in the orifices 41–44; and elements for causing the plates 23, 24 to move respectively in two substantially opposite directions so as to impart two pre-buckles 61–64 to each needle in opposite directions on either side of its rest position. The invention is applicable in particular to connectors for making an electrical connection between a test device and electronic components such as chips, for example.

19 Claims, 1 Drawing Sheet

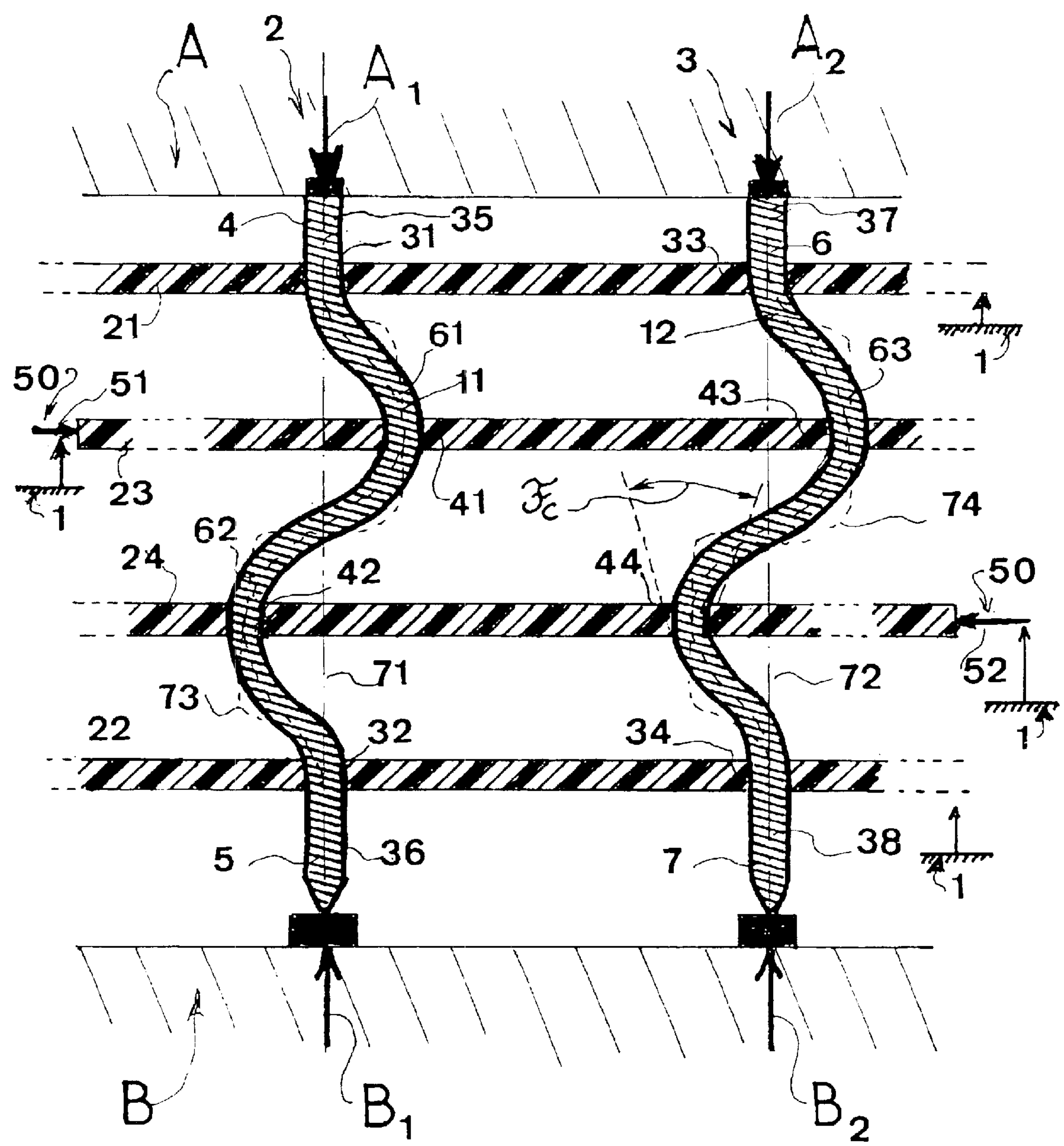
A
2
$A_1$
3
$A_2$
35
4
31
37
33
6
21
12
61
63
1
50
51
11
43
23
1
41
$\mathcal{F}_c$
74
62
24
42
44
50
71
72
52
73
1
22
32
34
5
36
7
38
1
B
$B_1$
$B_2$

MULTICONTACT ELECTRIC CONNECTOR

BACKGROUND OF THE INVENTION

The present invention relates to multiple-contact electrical connectors that find a particularly advantageous application in the field of devices used for testing electronic components such as microcomputer chips, for example, such multiple-contact electrical connectors serving to make mechanical contacts at determined locations with such electronic components in order to provide continuous electrical connection between the inputs/outputs of said components and the corresponding inputs/outputs of test devices.

DESCRIPTION OF THE RELATED ART

Electronic components are being made using ever-smaller dimensions, and their electrical contacts can have dimensions of less than 50 microns, with spacing between two adjacent contacts being of the order of 65 microns. At present, for an electronic component of the "electronic chip" type, the number of such contacts that are distributed over a surface of ever-smaller area can exceed several hundred.

In order to be able to connect the inputs/outputs of such electronic components electrically with the inputs/outputs of the devices used for testing them, it is therefore necessary to provide special multiple-contact electrical connectors.

By way of example, one such type of multiple-contact electrical connector is described in FR-A-2 748 813 filed by one of the present Applicants, and shown more particularly in FIG. 1 accompanying that document.

That multiple-contact electrical connector comprises a body defining a cavity in which three plates, respectively a top plate, an intermediate plate, and a bottom plate are received substantially parallel to one another, the plates being made of an electrically insulating material.

The plates have a multiplicity of through holes disposed so as to be suitable for passing contact needles made of electrically conductive material and of a length that is greater than the distance between the top and bottom plats so that the needles emerge from opposite sides of those two plates. One end of each needle, e.g. its end emerging from the top plate, is connected by means of a wire to the inputs/outputs of test devices, and the body of the connector is moved in such a manner as to cause the opposite ends of the needles which emerge from the bottom plate to come mechanically into contact with the inputs/outputs of the electronic component under test.

Nevertheless, it is clear that it is not possible to determine the length of said needles with absolute precision to ensure that their ends emerging from the bottom plate come simultaneously into contact with the inputs/outputs of the electronic component under test.

For this purpose, the connector also comprises means for moving the intermediate plate in at least one direction so as to pre-buckle the needles in one direction. In this way, by exerting stress on the body, it is possible to bring all of the needle ends emerging from the bottom plate into contact with the inputs/outputs of the electronic component under test, with the different levels of said inputs/outputs and the different lengths of the needles being compensated by the needles being deformed to a greater or lesser extent, said deformation being facilitated by the pre-buckling of the needles produced by displacing the intermediate plate as is described in greater detail in that prior document, in particular with reference to FIG. 5 accompanying that document.

The electrical connector described in that document gives satisfaction, however its structure does not always make it easy to accommodate the ever-increasing miniaturization of electronic components and the ever-increasing number of electrical contacts that need to be made in ever-smaller spaces.

SUMMARY OF THE INVENTION

An object of the present invention is thus to improve the multiple-contact electrical connector of the type described above.

More precisely, the present invention provides a multiple-contact electrical connector comprising a base of electrically insulating material, at least two pairs of input/output terminals, two needles of electrically conductive material respectively interconnecting the input/output terminals of each pair, first and second plates made of electrically insulating material, said first and second plates having through orifices, said needles being engaged through these orifices so that their ends emerge from opposite sides of said first and second plates, the emerging ends of said needles constituting the input/output terminals of said two pairs, and means for fixing the first and second plates relative to the base, the connector being characterized by the fact that it further comprises:

- at least third and fourth plates;
- means for positioning the third and fourth plates between said first and second plate, said second, third, and fourth plates having through orifices having at least one cross-section presenting a minimum value substantially equal to the cross-section of the needles, said orifices being made in the second, third, and fourth plates in such a manner that the needles are slidably mounted in said orifices; and
- means for causing the third and fourth plates to move respectively in two substantially opposite directions so as to impart two pre-buckles to each needle on either side of the needle's rest position.

BRIEF DESCRIPTION OF THE DRAWING

Other characteristics and advantages of the present invention appear from the following description given in purely illustrative but non-limiting manner with reference to the accompanying drawing, in which:

- the sole FIGURE is a diagram showing the principle on which an embodiment of a multiple-contact electrical connector of the invention is based.

DESCRIPTION OF THE PREFERRED EMBODIMENT

It is specified that when the subject matter of the invention is stated in the definition of the invention to comprise "at least one" element performing a given function, then the embodiment in question may comprise a plurality of such elements.

Similarly, if the embodiment of the invention as shown has a plurality of elements of identical function, and if in the description it is not stated that the subject matter of the invention must necessarily have some particular number of such elements, then the subject matter of the invention may be defined as having "at least one" of said elements.

It is also specified that the multiple-contact electrical connector of the invention constitutes an improvement of the connector described and shown in above-mentioned FR-A-2

748 813. Consequently, the description of an embodiment of the electrical connector of the present invention is restricted to describing means that constitute the essential characteristics of the invention. The means that contribute to making up the structure of the connector are known from that prior document and are not described in detail herein.

That said, the multiple-contact electrical connector comprises a base represented diagrammatically by reference 1, the base being made of an electrically insulating material, at least two pairs 2, 3 of input/output terminals 4–5, 6–7, two needles 11 and 12 made of electrically conductive material interconnecting the two input/output terminals 4–5, 6–7 of each pair 2, 3 respectively, and first and second plates 21, 22 made of electrically insulating material.

The first and second plates 21 and 22 have through orifices 31–34, with the needles 11, 12 being passed through respective pairs of orifices 31–33 and 32–34 of said plates 21, 22 so as to have their ends 35, 36, 37, and 38 emerging from opposite sides of the two plates. The emerging ends 35–38 constitute the input/output terminals 4–7 of the two pairs of terminals 2, 3.

The two needles 11 and 12 are advantageously, but not necessarily, mounted so as to be secured to the first plate 21 in its respective through orifices 31, 33, while they are advantageously, and necessarily, mounted to slide relative to the second plate 22, at least one cross-section of each through orifice 32, 34 made in said second plate presenting a minimum value that is substantially equal to the cross-section of the needles 11, 12.

The connector also has means for fixing the first and second plates 21, 22 relative to the base 1, and advantageously for doing so in such a manner as to ensure that they are perpendicular to the directions in which the two needles 11, 12 extend when they are in a rectilinear rest position, i.e. when they are not being subjected to any buckling deformation as described above, said directions being represented by axes 71, 72.

According to an essential characteristic of the invention, the connector further comprises at least third and fourth plates 23, 24, and means for positioning them between the first and second plates 21, 22, advantageously in such a manner that all four plates are mutually parallel. These third and fourth plates also have through orifices 41–44, each of which has at least one cross-section presenting a minimum value substantially equal to the cross-section of the needles 11, 12 so that the needles can slide in the orifices with as little clearance as possible.

By way of example, all of the plates made of electrically insulating material may be made of one of the following materials: ceramics, plastics, silicon, silica.

In order to encourage sliding of the needles 11, 12 in the orifices formed in particular through the second, third, and fourth plates 22, 23, and 24, the thicknesses of these plates, in particular in their portions that come into contact with the needles, are advantageously less than the cross-section of the needles.

Nevertheless, in order to obtain plates that are rigid, it is advantageous to give them thickness that is relatively great. Since the portions of the plate that are in contact with the needles are advantageously of relative thickness that is very small, it is advantageous, for example, to give the through orifices a frustoconical shape, as shown diagrammatically at $T_c$ in the sole FIGURE, with the small base of the frustoconical shape being of substantially the same section as the needles.

This frustoconical shape given to the orifices made through the plates also helps to guide the needles while they are being engaged in the orifices.

When the plates are made of a material such as silicon or the like, these orifices are obtained by the "deep etching" method, which is itself known.

The means for positioning the third and fourth plates between the first and second plates may, for example, be like those described in the above-cited prior document for mounting the intermediate plate relative to the body of the connector. Very briefly, such means are of the slider or like type.

The electrical connector also comprises means 50 represented diagrammatically by two arrows 51 and 52 for controlling movement of the third and fourth plates 23, 23, advantageously in two opposite directions so that each needle 11, 12 has two substantially opposite pre-buckles 61–62, 63–64 formed therein on either side of its rectilinear rest position as represented by the above-defined axes 71, 72. These means 50 may be of any type, and in particular they may be of the type described in the above-cited prior document for displacing the "intermediate" plate.

The multiple-contact electrical connector as described above operates and is used as follows.

It is assumed initially that the connector is for electrically connecting the terminals $A_1$, $A_2$ of one element A to two terminals $B_1$ and $B_2$ of another element B. One of the two elements A and B is constituted, for example, by a test device, and the other is constituted, for example, by an electronic component for testing.

The connector is disposed between these two elements A and B, with it being assumed, for example, that the element A is stationary in a given frame of reference. By means of its base 1, the connector is held relative to the element A in such a manner that the output terminals 4, 6 come into contact with the two terminals $A_1$, $A_2$ or are connected thereto by any suitable means, such as electrically conductive wires, for example. The wired solution is generally used for testing electronic components such as chips, since under such circumstances, the test device is always the same.

The third and fourth plates 23 and 24 are then moved in opposite directions to each other so as to impart the two above-defined pre-buckles to the two needles 11, 12.

The element B is then moved so that its terminals $B_1$ and $B_2$ are positioned facing the respective ends 36, 38 of the needles 11, 12. Since it is physically impossible for the ends 36, 38 of the needles 11, 12 emerging from the second plate 22 to lie all in the same plane (and the same applies to all of the terminals $B_1$, $B_2$ of the element B), pressure is exerted on the element B so as to be certain that all of the terminals $B_1$, $B_2$ do indeed come into mechanical contact with the ends 36, 38 of the needles. When there is a difference in level between the emerging ends of the needles 11, 12 and/or between the terminals $B_1$ and $B_2$ of the element B, then at least one needle is subjected to additional buckling, as represented by dashed lines 73, 74 in the sole FIGURE.

The additional buckling of each needle is shared between the two oppositely-directed pre-buckles of the needle. As a result, the overall lateral space occupied by the needles that have been subjected to buckling increases less than it does in the device described in the prior document, thus making it possible to provide electrical connectors having a larger number of needles closer to one another, and making it possible to test latest-generation electronic elements whose input/output terminals are ever more numerous and ever closer to one another in spaces that are ever smaller.

In the example described above with reference to the sole FIGURE, the connector has only two needles in order to simplify the drawing and the description given with reference to the drawing. Naturally, it will be understood that in reality the connector has a large plurality of needles.

Similarly, in some cases, more than two plates may be provided between the first and second plates 21 and 22.

What is claimed is:

1. A multiple-contact electrical connector comprising a base (1) of electrically insulating material, at least two pairs (2, 3) of input/output terminals (4–6), two needles (11, 12) of electrically conductive material respectively interconnecting the input/output terminals of each pair, first and second plates (21, 22) made of electrically insulating material, said first and second plates having through orifices (31–34), said needles being engaged through these orifices so that their ends (35–37) emerge from opposite sides of said first and second plates, the emerging ends of said needles constituting the input/output terminals (4–6) of said two pairs, and means for fixing the first and second plates relative to the base, the connector being characterized by further comprising:

at least third and fourth plates (23, 24);

means for positioning the third and fourth plates (23, 24) between said first and second plates (21, 22), said second, third, and fourth plates having through orifices (32, 34, 41–44) having at least one cross-section presenting a minimum value substantially equal to a cross-section of the needles (11, 12), said orifices being made in the second, third, and fourth plates in such a manner that the needles are slidably mounted in said orifices; and means (50) for causing the third and fourth plates (23, 24) to move respectively in two substantially opposite directions so as to impart two pre-buckles (61–64) to each needle on either side of a needle's rest position.

2. A connector according to claim 1, characterized by said needles (11, 12) engaging in the orifices (31, 33) formed in the first plate (21) and being secured to said first plate (21).

3. A connector according to claim 2, characterized by the first, second, third, and fourth plates (21, 22, 23, 24) being mutually parallel.

4. A connector according to claim 2, characterized by thicknesses of portions of the second, third, and fourth plates (22, 23, 24) in contact with the needles being smaller than the cross-section of said needles (11, 12).

5. A connector according to claim 1, characterized by the first, second, third, and fourth plates (21, 22, 23, 24) being mutually parallel.

6. A connector according to claim 5, characterized by thicknesses of portions of the second, third, and fourth plates (22, 23, 24) in contact with the needles being smaller than the cross-section of said needles (11, 12).

7. A connector according to claim 1, characterized by thicknesses of portions of the second, third, and fourth plates (22, 23, 24) in contact with the needles being smaller than the cross-section of said needles (11, 12).

8. A connector according to claim 1, characterized by the plates (21, 22, 23, 24) being made in one of the following materials: ceramics, plastic materials, silicon, silica.

9. A multiple-contact electrical connector comprising a base (1) of electrically insulating material;

two pairs (2, 3) of input/output terminals (4–6);

two needles (11, 12) of electrically conductive material respectively interconnecting the input/output terminals of each pair;

first and second plates (21, 22) made of electrically insulating material, said first and second plates having through orifices (31–34)

said needles being engaged through these orifices so that ends (35–37) of said needles emerge from opposite sides of said first and second plates, the emerging ends of said needles constituting the input/output terminals (4–6) of said two pairs;

means for fixing the first and second plates relative to the base, third and fourth plates (23, 24) spaced apart from each other;

means for positioning the third and fourth plates (23, 24) between said first and second plates (21, 22), said second, third, and fourth plates having through orifices (32, 34, 41–44) having a cross-section presenting a minimum value substantially equal to a cross-section of the needles (11, 12), the needles being slidably mounted in said orifices in the second, third, and fourth plates; and means (50) causing the third and fourth plates (23, 24) to move respectively in two substantially opposite directions to impart two pre-buckles (61–64) to each needle on either side of a needle's rest position.

10. A connector according to claim 9, wherein said needles (11, 12) engage in the orifices (31, 33) formed in the first plate (21) and are secured to said first plate (21).

11. A connector according to claim 10, wherein the first, second, third and fourth plates (21, 22, 23, 24) are mutually parallel to each other.

12. A connector according to claim 10, wherein the respectively second, third and fourth plates (22, 23, 24) have a portion in contact with each of said needles, said contact portion having a thickness smaller than the cross-section of said needle (11, 12).

13. A connector according to claim 9, wherein the first, second, third and fourth plates (21, 22, 23, 24) are mutually parallel.

14. A connector according to claim 13, wherein the respectively second, third and fourth plates (22, 23, 24) have a portion in contact with each of said needles, said contact portion having a thickness smaller than the cross-section of said needle (11, 12).

15. A connector according to claim 9, wherein contact portions of the second, third, and fourth plates (22, 23, 24) contacting the needles have thicknesses smaller than the cross-section of said needles (11, 12).

16. A connector according to claim 9, wherein the first, second, third and fourth plates (21, 22, 23, 24) are made in one of the following materials: ceramics, plastic materials, silicon, and silica.

17. A multiple-contact electrical connector, comprising:

a base (1);

first, second, third and fourth plates (21, 22, 23, 24) of electrically insulating material and spaced apart from each other;

orifices (31–34) in the first, second, third and fourth plates;

needles (11, 12) passing through first, second, third, and fourth plates via the orifices, the needles having ends emerging from each of the first and second plates;

pairs of input/output terminals (4–5, 6–7) formed by the emerging ends of the needles, a cross-section of each orifice of the second plate being substantially equal to a cross-section of the needle passing through the orifice, the first and second plates being fixed relative to the base with the first and second plates perpendicular to a direction of the needles passing through the first and second plates;

the third and fourth plates (23, 24) located intermediate the first and second plates, the needles slidably passing through the orifices of the third and fourth plates; and positioning means (50) positioning the third and fourth plates in two opposite directions, when the needles are in a rest position, to impart to each needle two substantially opposite pre-buckles (61–62, 63–64) formed on either side of a needle's rest position.

18. The connector of claim 17, wherein the needles slidably pass through the first and second plates.

19. The connector of claim 17, wherein the positioning means controls movement of the third and fourth plates in the two opposite directions.

* * * * *